United States Patent [19]

Sune et al.

[11] Patent Number: 5,332,467
[45] Date of Patent: Jul. 26, 1994

[54] CHEMICAL/MECHANICAL POLISHING FOR ULSI PLANARIZATION

[75] Inventors: Ching-Tzong Sune; Chih-Yuan Lu, both of Hsinchu, Taiwan

[73] Assignee: Industrial Technology Research Institute, Hsinchu, Taiwan

[21] Appl. No.: 122,948

[22] Filed: Sep. 20, 1993

[51] Int. Cl.⁵ ............... H01L 21/306; B44C 1/22; C03C 15/00; C23F 1/00
[52] U.S. Cl. .................. 156/636; 156/637; 156/643; 156/645; 156/644; 156/656; 156/657; 437/225
[58] Field of Search ............ 156/636, 637, 643, 645, 156/655, 657, 659.1, 662, 667, 644, 656; 437/225, 228, 235, 238, 245; 51/281 R, 317

[56] References Cited

U.S. PATENT DOCUMENTS

| | | | |
|---|---|---|---|
| 4,676,867 | 6/1987 | Elkins et al. | 156/643 |
| 5,036,015 | 6/1991 | Sandhu et al. | 437/8 |
| 5,081,421 | 1/1992 | Miller et al. | 324/671 |
| 5,081,796 | 1/1992 | Schultz | 51/165 |
| 5,084,071 | 1/1992 | Nenadic et al. | 51/309 |
| 5,084,419 | 1/1992 | Sakao | 437/228 |
| 5,094,972 | 3/1992 | Pierce et al. | 437/67 |
| 5,246,884 | 9/1993 | Jaso et al. | 437/225 |

OTHER PUBLICATIONS

VLSI Technology, published by McGraw-Hill International-Singapore, 1988, pp. 255-257.
"A Planarization Technology Using a Bias-Deposited Dielectric Film and an Etch-Back Process" published in IEEE Transactions on Electron Devices, No. 1988.

Primary Examiner—William Powell
Attorney, Agent, or Firm—George O. Saile; Stephen B. Ackerman

[57] ABSTRACT

A method of planarizing a wafer surface by using a polishing stop with chemical/mechanical polishing is described. A semiconductor wafer, on which there is a rugged surface with broad indentations, is provided. A first layer is formed over the rugged surface. A hard film layer is formed over the first layer. The first layer and the hard film layer are patterned to form polishing stop islands in the broad indentations. A second layer is formed over the rugged surface and the polishing stop islands, to create a top surface for polishing, the top surface and the rugged surface being less hard than the hard film layer. The top surface is polished in a vertical direction to remove portions of the top surface, until the top surface is co-planar with the top of the polishing stop islands. The remainder of the hard film layer is removed to complete the planar surface.

20 Claims, 4 Drawing Sheets

CHEMICAL/MECHANICAL POLISHING FOR ULSI PLANARIZATION

BACKGROUND OF THE INVENTION (1) Field of the Invention

The invention relates to semiconductor manufacturing, and, more particularly, to a method for making planar interlevel dielectric surfaces, using chemical/mechanical polishing and a hard film to act as a polishing stop.

(2) Description of the Related Art

Semiconductor devices created on a substrate need to be connected together, which is accomplished typically by a layer of metal that contacts the devices and connects them together or to pads at the exterior surface of the chip. As the density of semiconductor devices increases, there is an increasing need to use more than one layer of metallization for interconnection. Each layer of metal is separated by an insulating layer, also referred to as an interlevel dielectric (ILD), with connections made between the layers by vias in the ILD. However, for each additional layer of metal, the top surface of the ILD layers become less and less planar, or smooth, which ultimately leads to reliability problems due to the difficulty of depositing metal on these uneven surfaces.

There is thus a need to planarize the ILD surfaces. Planarization in semiconductor manufacturing has typically been accomplished by such techniques as BPSG reflow, planarization with resist, or SOG planarization. In BPSG reflow, a layer of borophosphosilicate (BPSG) glass is deposited and then heated to a temperature of greater than 800° C. The heating step causes this material to soften and flow, providing a smoother surface, as described in S.M. Sze, "VLSI TECHNOLOGY", published by McGraw-Hill Internaltional - Singapore, 1988, pages 255-257. However, the temperatures used in this process are too high if aluminum, the most common metallization material, has already been deposited on the wafer. Also, BPSG reflow is most effective for narrow indentations, that is, very small areas of the ILD surface. Broad indentations in the surface are not made planar, and thus BPSG reflow does not provide for adequate "global" planarization (planarization across the entire wafer surface).

A second planarization technique is planarization with resist or "resist etchback". One example method is described by Fujii et al in "A Planarization Technology Using a Bias-Deposited Dielectric Film and an Etch-Back Process", published in IEEE Transactions on Electron Devices, November, 1988. However, the resist etchback techniques require an increased dielectric thickness, additional process steps, and typically require that the dielectric and resist have similar etch rates, which is difficult to accomplish and control.

An example of SOG planarization is described in U.S. Pat. No. 4,676,867 by Elkins et al. This method requires the curing of a spin-on glass (SOG) layer, which converts the SOG to silicon dioxide. However, contaminants result when the structure is heated to greater than 300° C., which evolve and corrode the aluminum vias.

A more recent planarization method is known as chemical/mechanical polishing, or CMP. A semiconductor wafer is held and rotated against a polishing surface, on which there is a polishing slurry containing abrasive material such as alumina or silica. At the same time, a chemical etchant may be introduced so that material is removed from the wafer by both chemical and mechanical means. U.S. Pat. Nos. 5,084,419 and 5,084,071 describe the use of CMP for providing a smooth substrate, prior to any metallization steps.

One difficulty in using CMP is determining when the planarization is complete. U.S. Pat. No. 5,036,015 describes a method to detect the planarization endpoint using the frictional difference between two materials. U.S. Pat. No. 5,081,421 describes the use of a capacitive measure of the dielectric thickness for insitu endpoint detection. U.S. Pat. No. 5,081,796 uses a laser interferometer for endpoint detection. However, these methods all require additional instrumentation to detect the completion of the chemical/mechanical polishing.

SUMMARY OF THE INVENTION

It is therefore an object of this invention to provide a simple method for providing a polishing stop when using chemical/mechanical polishing for planarization of a wafer surface.

It is a further object of this invention to provide a simple method for providing a polishing stop when using chemical/mechanical polishing for planarization of interlevel dielectric surfaces with multiple levels of metallization.

This object is achieved by providing a semiconductor wafer, on which there is a rugged surface with broad indentations. A first layer is formed over the rugged surface. A hard film layer is formed over the first layer. The first layer and the hard film layer are patterned to form polishing stop islands in the broad indentations. A second layer is formed over the rugged surface and the polishing stop islands, to create a top surface for polishing, the top surface and the rugged surface being less hard than the hard film layer. The top surface is polished in a vertical direction to remove portions of the top surface, until the top surface is co-planar with the top of the polishing stop islands. The remainder of the hard film layer is removed to complete the planar surface.

DESCRIPTION OF THE PREFERRED EMBODIMENTS

Figure 1:
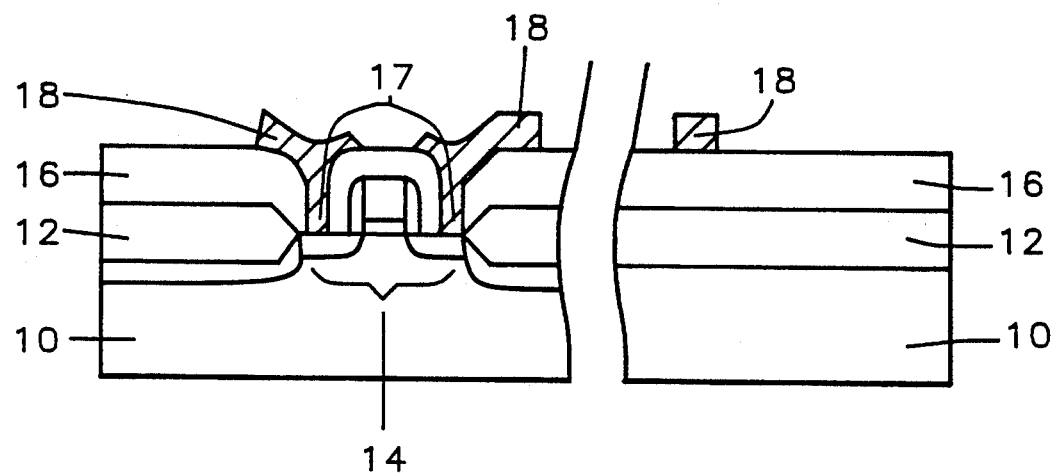
FIGS. 1 to 8 are a cross-sectional representation of a method for providing a CMP polishing stop for planarization of interlevel dielectrics.

Referring now to FIG. 1, a substrate 10 is shown, along with field isolation region 12 and transistor 14. These are formed by methods well known in the art and as they are not significant to the invention, will not be described in detail. Although a metal oxide semiconductor (MOS) device is depicted as transistor 14, it will be understood by those familiar with the art that a bipolar transistor could also be used.

A dielectric layer 16, composed of, for instance, silicon oxide formed by low pressure chemical vapor deposition (LPCVD), is deposited to a thickness of between about 2000 and 5000 Angstroms. This layer is patterned to form vias 17 through which metal layer 18 contacts with the active regions of transistor 14. The metal layer 18 is formed of titanium / aluminum (Ti/Al), titanium nitride / aluminum (TiN/Al), or titanium / titanium nitride / aluminum (Ti/TiN/Al). The preceding metal combinations could also be formed with silicon or copper in place of the aluminum. Titanium nitride / tungsten (TiN/W) could also be used, as could many other metal combinations as is well known by those skilled in the art. The metal layer 18 is formed to a thickness of between about 8000 and 12,000 Angstroms and is deposited by sputtering, evaporation, or chemical vapor deposition. This metal layer is then patterned as required for device interconnection.

Figure 2:
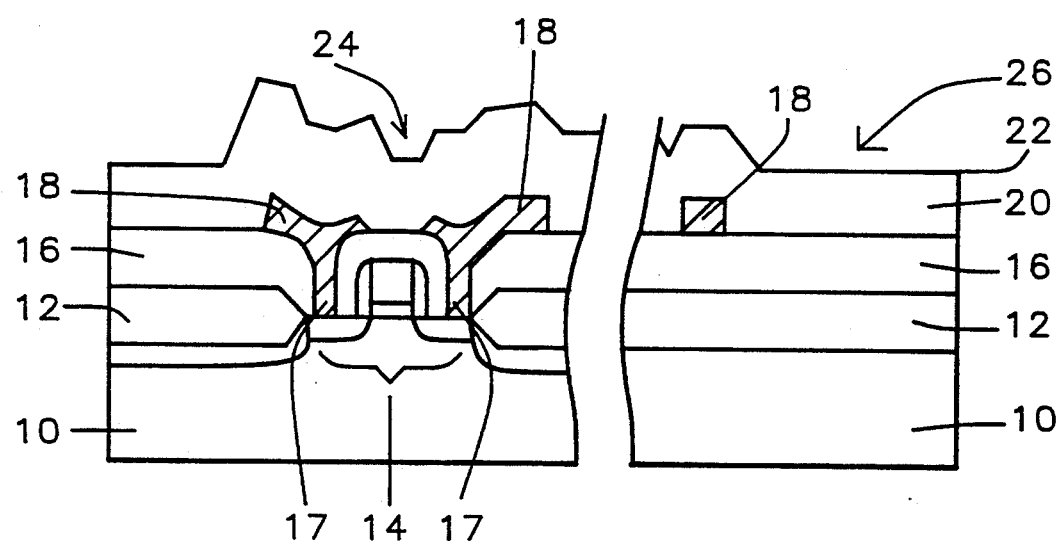

Referring now to FIG. 2, a dielectric layer 20 is blanket-deposited by low pressure chemical vapor deposition (LPCVD) over dielectric layer 16 and metal layer 18. This layer is a high-quality oxide, for instance, silicon dioxide $SiO_2$, formed to a thickness of between about 5000 and 10,000 Angstroms. In the prior art SOG planarization, curing of the spin-on-glass (SOG) causes contamination and degradation of the adjacent metal, which is avoided in this invention by the use of a high-quality oxide, and no curing requirement.

As can be seen in FIG. 2, the top surface 22 follows the contours of the underlying surfaces and is not planar. Narrow indentations 24 and broad indentations 26 are formed, and it is these broad indentations that prior art processes such as BPSG reflow can not fill, thus failing to provide global planarization.

Figure 3:
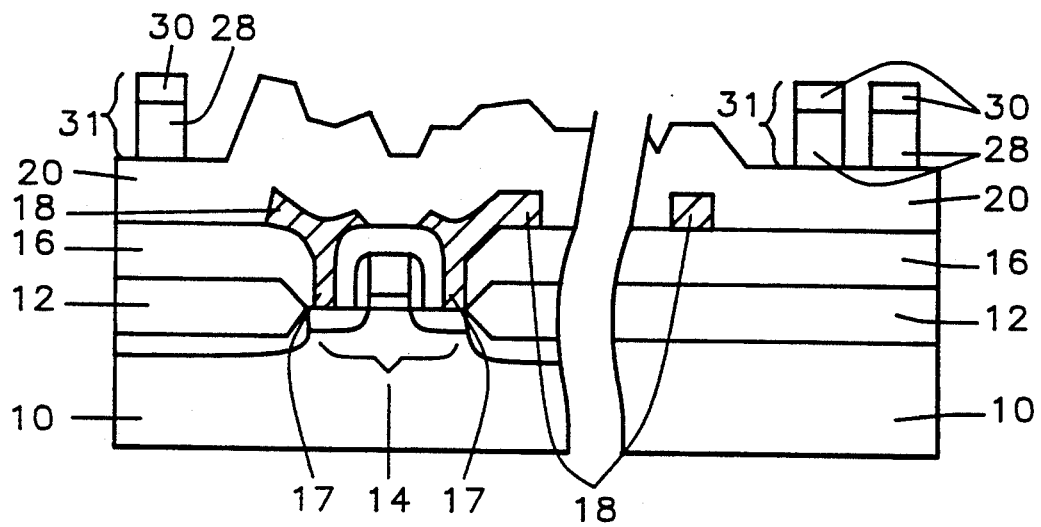

Referring now to FIG. 3, second dielectric layer 28, which would typically be silicon oxide deposited by LPCVD, is deposited to a thickness of between about 5000 and 10,000 Angstroms over first dielectric 20. In the critical step of this invention, a hard film layer 30 is deposited. This is preferably diamond, which is deposited, for example, by radio frequency (RF) plasma CVD as described in "Diamond-like carbon as an electrical insulator of copper devices for chip cooling", by E. Marotta et al, in Thin Solid Films, 206(1991), to a thickness of between about 1000 and 2000 Angstroms. In this process, the diamond-like carbon (DLC) film is formed by the r.f. plasma decomposition of acetylene ($C_2H_2$). The Knoop hardness of the diamond-like carbon thus formed is between about 3000 and 9000 kg/mm$^2$. This layer could also be formed of materials such as niobium carbide NbC, niobium Nb, cobalt Co or aluminum oxide $Al_2O_3$. The primary requirement for this hard film layer material is that it have a hardness greater than that of silicon oxide, or whatever alternate dielectric material is being used. The hardnesses of various relevant materials are shown below in Table I.

TABLE I (source: CRC Handbook of metal etchants, P. Walker and W. H. Tam, CRC Press Inc., 1991)

| Material | Hardness (Mohs scale) |
| --- | --- |
| diamond | 10 |
| niobium carbide NbC | 9+ |
| $Al_2O_3$ | 9 |
| cobalt Co | 8+ |
| niobium Nb | 7-8 |
| silicon | 7 |
| $SiO_2$ | 6-7 |
| $Si_3N_4$ | 6-7 |

The hard film layer 30 will be used as a polishing stop for chemical/mechanical polishing of the top surface. The polishing stop film was chosen to have a high selectivity of polishing rate as compared to the dielectric, and the hardness of the polishing stop film is larger than that of the polishing slurry, or may be less than the slurry hardness but greater than the dielectric.

The wafer is now patterned by conventional lithography, and etched to form polishing stop islands 31. When diamond is used for layer 30, it is etched by, for example, ion-beam assisted etching, as described in "Ion-beam-assisted etching of diamond", N.N. Efremow et al, J. Vac. Sci Technol., Jan/Feb 1985. This approach uses a Xe+beam and a reactive gas flux of $NO_2$ to achieve a high etch rate ratio of 20 between the diamond and an aluminum mask.

Layer 28 is etched, using the same mask as for the hard film layer 30, by reactive ion etch or wet chemical etching. A reactive ion etch of layer 28 would use, for example, $CHF_3$ as a source gas with the addition of $O_2$. This completes formation of polishing stop islands 31, which are formed in broad indentations on the top surface 22.

Figure 4:
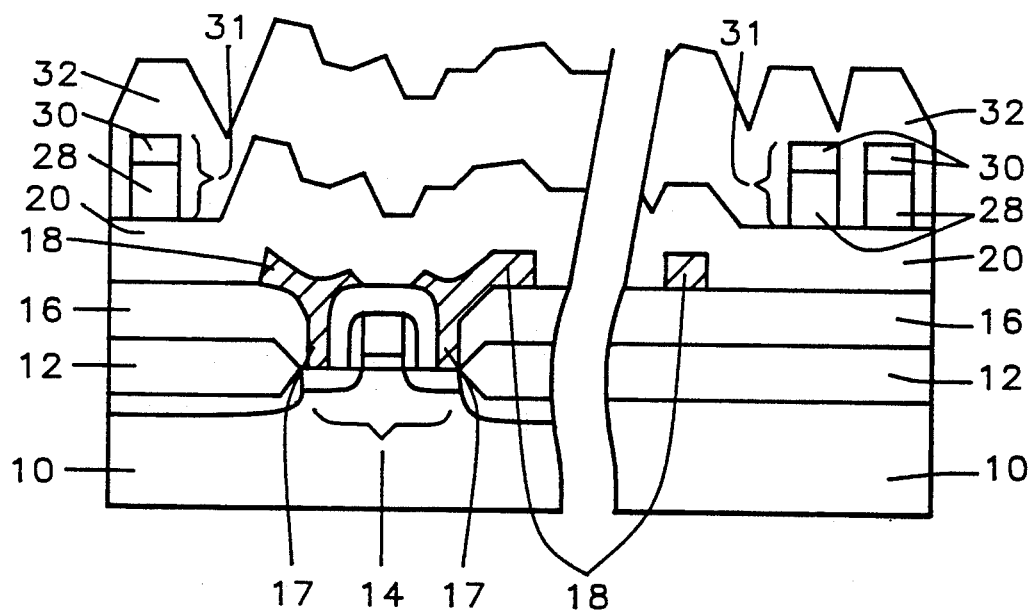

Referring now to FIG. 4, a third dielectric layer 32, of, for example, $SiO_2$, is deposited to a thickness of between about 10,000 and 15,000 Angstroms. This layer fills in the gaps between the polishing stop islands, and other indentations on the surface.

Figure 5:
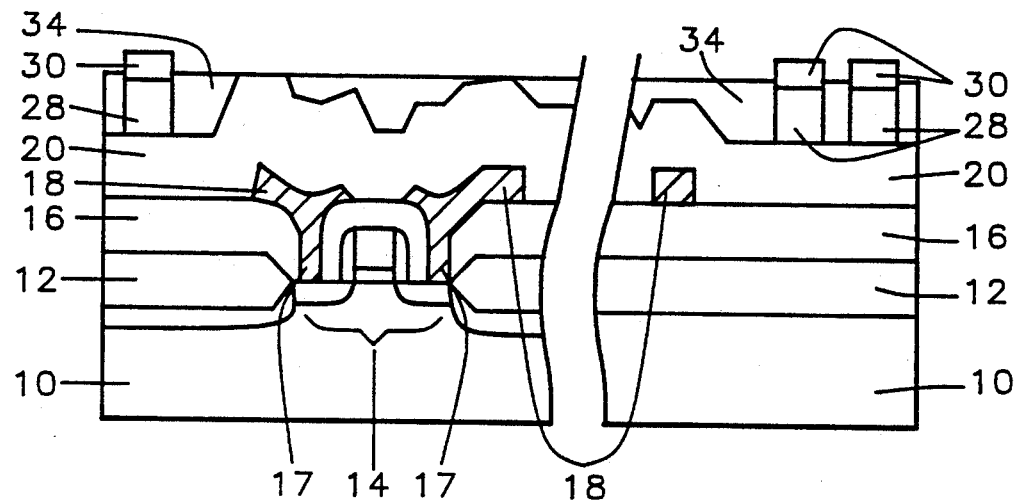

Referring now to FIG. 5, chemical/mechanical polishing is used to planarize the top surface. The wafer is held and rotated against a polishing surface, on which there is a polishing slurry containing abrasive material such as alumina or silica. At the same time, a chemical etchant may be introduced, as is well known in the art, so that material is removed from the wafer by both chemical and mechanical means. As the polishing rate of the polishing stop islands is relatively low compared to the rate of the surrounding dielectric, the polishing will stop as the wafer surface reaches the level of the top hard film of the polishing stop islands. Due to the chemical etch, the surface of the now planar layer 34 will be slightly lower than the top of polishing stop island 30.

There are several possible combinations of hardnesses of the materials used for the top hard film, the polishing slurry, and the dielectric. The polishing slurry hardness must always be greater than that of the dielectric, in order for the mechanical polishing to take place. If the material chosen for the top hard film has a hardness that is greater than that of the polishing slurry (for instance, a diamond film (hardness 10 on the Mohs scale) with $Al_2O_3$ slurry (hardness 9)), the hard film layer will inhibit further polishing when the polishing surface reaches the hard film. The thickness of the hard film layer may be kept to a minimum in this instance, which will improve the overall planarization after the hard film is removed.

The hardness of the hard film layer material could also be chosen to be between that of the slurry and dielectric. As long as the hard film hardness is much greater than that of the dielectric, endpoint detection is not needed. The completion of polishing is controlled by monitoring the polishing time. Since the slurry will also polish the hard film layer, though at a lower rate than the dielectric, a thicker hard film layer is required to provide sufficient process latitude. If the hard film hardness is close to that of the dielectric, then a combination of the hard film layer and endpoint detection could be used to planarize the wafer.

Figure 6:
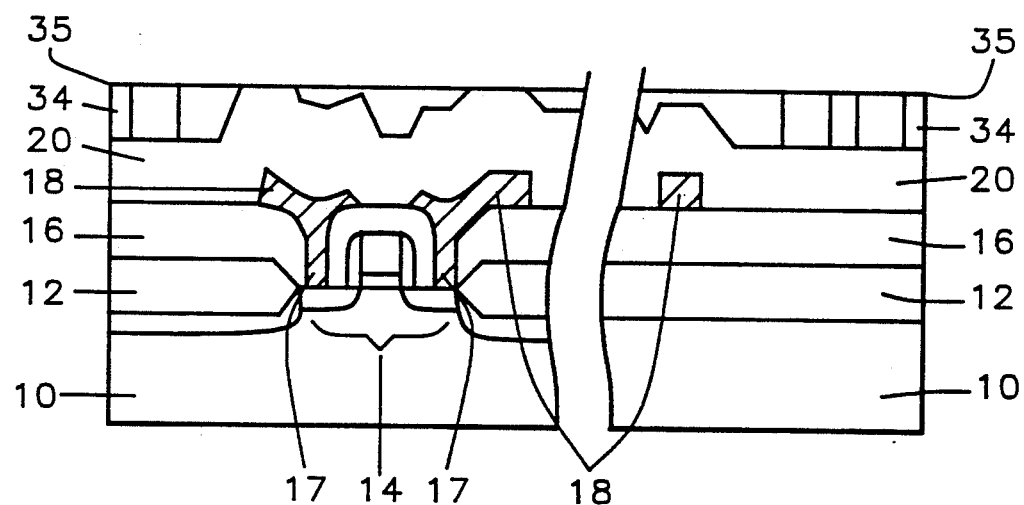
Figure 7:
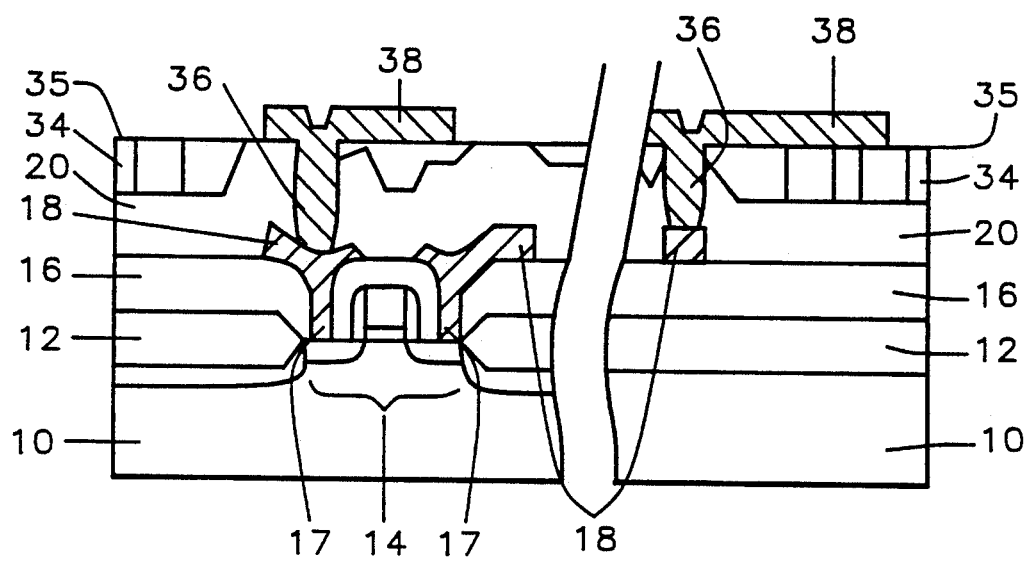

Referring now to FIG. 6, hard film layer 30 is removed by either dry or wet chemical etching or, for example, ion-beam-assisted etching for a diamond film. This results in the final, globally planarized surface 35. If more layers of metal are desired to be added, vias 36 may be etched as shown in FIG. 7, to provide openings to contact the first metal. A second metal layer 38 is deposited, using the same materials and process as the first metal layer, to fill vias 36 and on top surface 35. It is patterned by conventional lithography and etching, and then a similar planarization process as that described above is accomplished.

Figure 8:
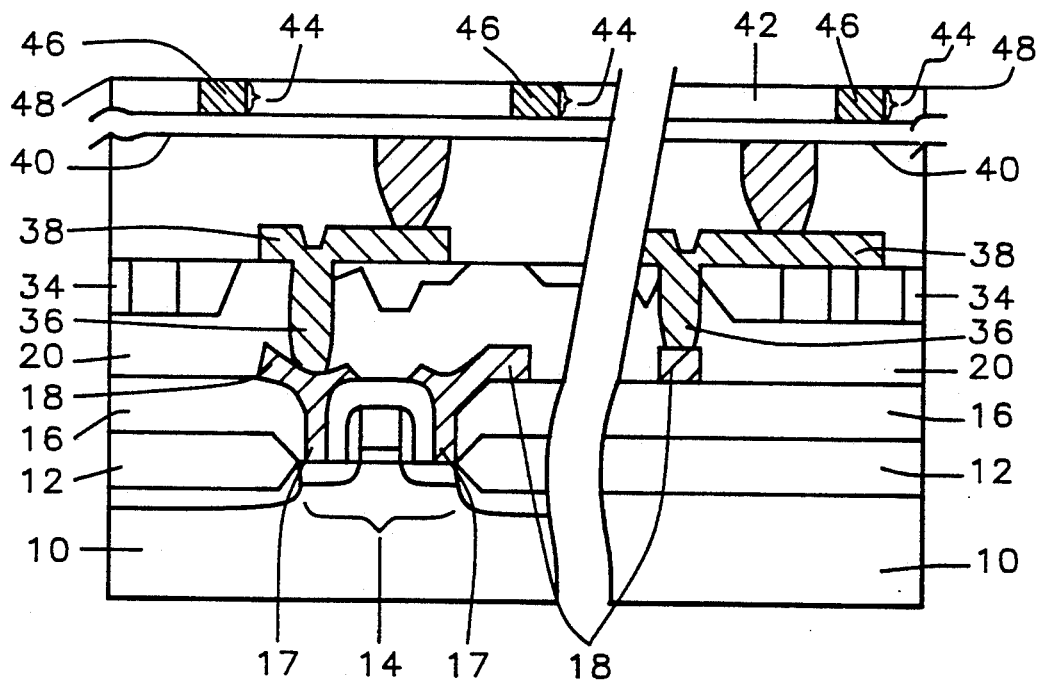

Referring now to FIG. 8, this would result in planar top surface 40. This process could be repeated to provide n planarized surfaces with n dielectric/via/metal layers for up to n levels of metallization, with nth dielectric 42, nth via 44, nth metal 46 and nth planar top surface 48.

Referring now back to FIG. 2, it may be understood by those skilled in the art that top surface 22 could be any rugged surface, regardless of the underlying structures. Polishing islands may be formed in broad indentations 26, and a subsequent layer added which is polished back using the chemical/mechanical polishing steps discussed above. The hard film layer needs only to be harder than the surfaces that are to be polished, in order for the hard film to act as a polishing stop. The hard film is then removed, resulting in a planar top surface.

While the invention has been particularly shown and described with reference to the preferred embodiments thereof, it will be understood by those skilled in the art that various changes in form and details may be made without departing from the spirit and scope of the invention.

What is claimed is:

1. A method of forming a planar surface on a semiconductor wafer, on which there is a rugged surface with broad indentations, comprising the steps of:
   forming a first layer over said rugged surface;
   forming a hard film layer over said first layer;
   patterning said first layer and said hard film layer to form polishing stop islands in the broad indentations;
   forming a second layer over said rugged surface and said polishing stop islands, to create a top surface for polishing, said top surface and said rugged surface being less hard than said hard film layer;
   polishing said top surface in a vertical direction to remove portions of said top surface, until said top surface is co-planar with top of said polishing stop islands; and
   removing the remainder of said hard film layer to complete said planar surface.

2. The method of claim 1 wherein said polishing is by chemical/mechanical polishing.

3. The method of claim 2 wherein said chemical/mechanical polishing is with a polishing slurry containing aluminum oxide.

4. The method of claim 1 wherein said hard film layer is a diamond film.

5. The method of claim 4 wherein said diamond film is a diamond-like carbon film.

6. The method of claim 4 wherein said diamond film is patterned by ion beam assisted etching.

7. The method of claim 1 wherein said hard film layer is niobium carbide.

8. A method of forming a planar surface on a semiconductor wafer on which there is a first dielectric layer and a patterned first metal layer, comprising the steps of:
   forming a second dielectric layer with broad indentations over said first dielectric layer and said patterned first metal layer;
   forming a third dielectric layer over said second dielectric layer;
   forming a hard film layer over said third dielectric layer;
   patterning said third dielectric layer and said hard film layer to form polishing stop islands in said broad indentations;
   forming a fourth dielectric layer over said second dielectric layer and said polishing stop islands, to create a top surface for polishing, said fourth and second dielectric layers being less hard than said hard film layer;
   polishing said top surface in a vertical direction to remove portions of said top surface, until said top surface is co-planar with top of said polishing stop islands; and
   removing the remainder of said hard film layer to complete said planar surface.

9. The method of claim 8 wherein said polishing is by chemical/mechanical polishing.

10. The method of claim 9 wherein said chemical/mechanical polishing is with a polishing slurry containing aluminum oxide.

11. The method of claim 8 wherein said hard film layer is a diamond film.

12. The method of claim 11 wherein said diamond film is patterned by ion beam assisted etching.

13. The method of claim 8 wherein said second, third and fourth dielectric layers are silicon oxide deposited by low pressure chemical vapor deposition.

14. A method of forming a semiconductor wafer having multiple levels of metallization with planar interlevel dielectric layers between each level of metallization, on which there is a first dielectric layer with broad indentations and a patterned first metal layer, comprising the steps of:
   forming a second dielectric layer over said first dielectric layer and said patterned first metal layer;
   forming a third dielectric layer over said second dielectric layer;
   forming a hard film layer over said third dielectric layer;
   patterning said third dielectric layer and said hard film layer to form polishing stop islands in the broad indentations;
   forming a fourth dielectric layer over said second dielectric layer and said polishing stop islands, to create a top surface for polishing, said fourth and second dielectric layers being less hard than said hard film layer;
   polishing said top surface in a vertical direction to remove portions of said top surface, until said top surface is co-planar with top of said polishing stop islands; and
   removing the remainder of said hard film layer to complete said planar surface and form an interlevel dielectric.

15. The method of claim 14 further comprising the steps of:
   etching said planar surface to create vias and thus expose said first metal layer; and
   forming and patterning a second metal layer on said planar surface and in said vias.

16. The method of claim 15 further comprising the steps of creating a plurality of planar interlevel dielectrics and levels of metal on top of said second metal layer, by repeating the same steps.

17. The method of claim 14 wherein said polishing is by chemical/mechanical polishing.

18. The method of claim 17 wherein said chemical/mechanical polishing is with a polishing slurry containing aluminum oxide.

19. The method of claim 14 wherein said hard film layer is a diamond film.

20. The method of claim 19 wherein said diamond film is a diamond-like carbon film.

* * * * *